(12) United States Patent
Samala et al.

(10) Patent No.: US 9,515,667 B2
(45) Date of Patent: Dec. 6, 2016

(54) OSCILLATOR WITH FREQUENCY CONTROL LOOP

(71) Applicant: Texas Instruments Incorporated, Dallas, TX (US)

(72) Inventors: Sreekiran Samala, Richardson, TX (US); Vineet Mishra, Bangalore (IN); Mahadevan Shankara Venkiteswaran, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/587,951

(22) Filed: Dec. 31, 2014

(65) Prior Publication Data

US 2016/0191067 A1  Jun. 30, 2016

(51) Int. Cl.
  *H03L 7/099* (2006.01)
  *H03B 5/24* (2006.01)
  *H03L 1/02* (2006.01)
  *H03L 7/095* (2006.01)
  *H03L 7/18* (2006.01)

(52) U.S. Cl.
  CPC ............... *H03L 7/0995* (2013.01); *H03B 5/24* (2013.01); *H03L 1/026* (2013.01); *H03L 7/095* (2013.01); *H03L 7/099* (2013.01); *H03L 7/18* (2013.01)

(58) Field of Classification Search
  CPC ............ H03L 7/099; H03L 7/18; H03L 1/026; H03L 7/095; H03L 7/0995; H03B 5/24
  USPC ................... 331/185, 34, 16, 1 R, 176, 36 C
  See application file for complete search history.

(56) References Cited

U.S. PATENT DOCUMENTS

| | | | |
|---|---|---|---|
| 6,614,313 B2 * | 9/2003 | Crofts | H03K 3/0231 331/1 R |
| 2006/0284696 A1 * | 12/2006 | Mui | H03L 5/00 331/185 |
| 2008/0191778 A1 * | 8/2008 | Huang | G06G 7/18 327/336 |

* cited by examiner

*Primary Examiner* — Arnold Kinkead
(74) *Attorney, Agent, or Firm* — John R. Pessetto; Charles A. Brill; Frank D. Cimino

(57) ABSTRACT

Circuitry for providing an oscillating output signal. The circuitry comprises a transconductance circuit having a first input, a second input, and an output. The circuitry further comprises an oscillator circuit coupled to receive voltage from the output of the transconductance circuit, wherein the oscillating output signal is responsive to an output of the oscillator circuit. Also included are circuitry for providing a first voltage to the first input of the transconductance circuit and a frequency controlled circuit for providing a second voltage to the second input the transconductance circuit. The second voltage is response to a frequency of operation of the frequency controlled circuit, and the frequency of operation of the frequency controlled circuit is responsive to feedback from the output of the oscillator circuit.

10 Claims, 6 Drawing Sheets

OSCILLATOR WITH FREQUENCY CONTROL LOOP

CROSS-REFERENCES TO RELATED APPLICATIONS

Not Applicable.

STATEMENT REGARDING FEDERALLY SPONSORED RESEARCH OR DEVELOPMENT

Not Applicable.

BACKGROUND OF THE INVENTION

The preferred embodiments relate to electronic oscillators.

Electronic oscillators are well-known devices operable to produce an oscillating output signal, where in the case of a relaxation oscillator the output is nonsinusoidal, such as a triangle wave or a square wave. A typical relaxation oscillator, as further detailed below, includes a feedback loop and one or more capacitors that control the frequency of the oscillator output by, and in response to the time of, the charging and discharging of the capacitor(s). The relaxation oscillator output, therefore, changes state (e.g., from a rising transition to a falling transition) as the status of the capacitor(s) switches between charging and discharging.

Uses for electronic oscillators are also well-known for timing and synchronization and occur in numerous electronic circuits, devices, and industries. In many of these applications, various or all of the oscillator components are combined into an integrated circuit. As such, design considerations contemplate the oscillator as well as the overall integrated circuit. For example, with respect to the oscillator, key considerations are to reduce the effects of non-idealities in the oscillator and to ensure desired precision or lack of error in the output frequency. As another example, with respect to the integrated circuit, and of course the oscillator it includes, power consumption should be minimized, particularly in instances where the device for which the oscillator is operating has limited or consumable power (e.g., in battery-operated applications).

By way of further background, FIG. 1 illustrates a schematic of a typical prior art relaxation oscillator 10. Oscillator 10 includes a current stage 100, a charging stage 200, and a comparator/output stage 300.

Current/reference stage 100 includes a differential amplifier 102 having a non-inverting input connected to receive a bias voltage, $V_{BG}$, and an inverting input coupled to a resistor R1 and to the drain of p-channel transistor (P1). The output of amplifier 102 is connected to the gate of p-channel transistor P1 and also to the respective gates of each of p-channel power transistors MP1 and MP2, which, along with p-channel transistor P1, all have their sources connected to a voltage supply, $V_{DDLDO}$, from a low dropout voltage source. The drain of transistor MP1 is connected to a node 202 of charging stage 200, and the drain of transistor MP2 is connected to a node $V_{REF}$, which is the voltage across a reference resistor $R_f$ relative to ground.

In general and shown schematically to the left of charging stage 200, there is an p-channel transistor P2 with its source connected to node 202, its drain connected to a node 204, and its gate connected to a first output $/f_{CLKO}$ of comparator/output stage 300. Node 204 is further connected to a drain of an re-channel transistor N1 that has its drain connected to ground and its gate connected to first output $/f_{CLKO}$ of comparator/output stage 300. Node 204 is also connected to a first input of a comparator C1 in comparator/output stage 300, and node 204 is also connected through a capacitor $C_{f1}$ to a reference voltage, which in the preferred embodiments is ground.

In general and shown schematically to the right of charging stage 200, there is a p-channel transistor P3 with its source connected to node 202, its drain connected to a node 206, and its gate connected to a second output $f_{CLKO}$ (complementary to first output $/f_{CLKO}$) of comparator/output stage 300. Node 206 is further connected to a drain of an n-channel transistor N2 that has its source connected to ground and its gate to second output $f_{CLKO}$ of comparator/output stage 300. Node 206 is also connected to a first input of a comparator C2 in comparator/output stage 300, and node 206 is also connected through a capacitor $C_{f2}$ to ground.

As already suggested above, comparator/output stage 300 includes comparators C1 and C2. Each of these comparators has a first and second input, with the respective first inputs already described, and the second inputs both connected to receive the reference voltage, $V_{REF}$. The respective output of each of comparators C1 and C2 is connected to a respective first input of respective NAND gates ND1 and ND2, with the second input of NAND gates ND1 and ND2 cross-coupled to the output of the opposite NAND gate, ND2 and ND1, respectively. Moreover, the output of NAND gate ND1 is connected through an inverter IN1 to provide first output $/f_{CLKO}$, and the output of NAND gate ND2 is connected through an inverter IN2 to provide second output $f_{CLKO}$.

The operation of oscillator 10 is as follows, and should be generally understood to provide an oscillating signal, which is complementary at first output $/f_{CLKO}$ and second output $f_{CLKO}$. More specifically, as the feedback to amplifier 102 reaches equilibrium, power transistors MP1 and MP2 are enabled to source both node 202 and provide current through reference resistor $R_f$, thereby establishing the reference voltage $V_{REF}$ to comparators C1 and C2. Given the complementary conductivity type of transistor P2 relative to transistor N1, and similarly of transistor P3 relative to transistor N2, after startup one of transistors P2 or P3 is enabled, while the other is disabled, and at the same time one of the common-gate-connected transistors N1 or N2 is therefore disabled, while the other is enabled. For example, assuming transistor P2 is enabled then transistor N1 is disabled; at the same time, transistor P3 is disabled and transistor N2 is also enabled. Such states allow capacitor $C_{f1}$ to begin to charge, while capacitor $C_{f2}$ begins to discharge and, thus, nodes 204 and 206 provide opposing voltages to the first inputs of comparator C1 and C2. These voltages are compared the second inputs which receive $V_{REF}$, eventually causing the respective outputs of comparators C1 and C2 to reverse digital state, which pass through NAND gates ND1 and ND2, and inverters IN1 and IN2, likewise causing complementary outputs $/f_{CLKO}$ and $f_{CLKO}$ also to change state. These complementary outputs $/f_{CLKO}$ and $f_{CLKO}$ are fed back to the gates of transistor pairs P2/N1 and P3/N2, so that, for example, transistor P2 is disabled, transistors P3 and N1 are enabled, while transistor N2 is also disabled, which consequently causes an eventual reverse in the complementary outputs $/f_{CLKO}$ and $f_{CLKO}$. In this manner, therefore, one of capacitors $C_{f1}$ and $C_{f2}$ charges while the other discharges, and the outputs of $/f_{CLKO}$ and $f_{CLKO}$ provide an oscillating signal, with a timing constant dependent on the values of $C_{f1}$ and $C_{f2}$ (typically matched) and reference resistor $R_f$.

While the above oscillator 10 and comparable approaches have proven useful and workable in various implementations, the present inventors recognize that such approaches may have drawbacks. For example, while ideally the frequency (and corresponding time constant) of the oscillator depends solely on the values of $C_{f1}$, $C_{f2}$, and $R_f$, in actuality there are non-idealities inherent in the design. For example, once $V_{REF}$ is met by the charge across one of $C_{f1}$ and $C_{f2}$, there is a corresponding delay in the one of the comparators C1 and C2 that detects that met threshold, and this delay adds to the period of outputs /$f_{CLKO}$ and $f_{CLKO}$. As another example, if any of $C_{f1}$, $C_{f2}$, and $R_f$ are integrated onto the same chip as the remaining oscillator components, additional error is introduced by the variability of capacitance and resistance values, as may exist from manufacturing variance and temperature dependence. Indeed, some architectures necessitate that these capacitors and resistor are on-chip, thereby introducing such additional error. The above approaches also may be limiting in the sense that certain designs that require an oscillator may demand relatively high precision, in which case the above approach may not be not usable.

Given the preceding, the present inventors have identified potential improvements to the prior art, as are further detailed below.

BRIEF SUMMARY OF THE INVENTION

In a preferred embodiment, there is circuitry for providing an oscillating output signal. The circuitry comprises a transconductance circuit having a first input, a second input, and an output. The circuitry further comprises an oscillator circuit coupled to receive voltage from the output of the transconductance circuit, wherein the oscillating output signal is responsive to an output of the oscillator circuit. Also included are circuitry for providing a first voltage to the first input of the transconductance circuit and a frequency controlled circuit for providing a second voltage to the second input the transconductance circuit. The second voltage is response to a frequency of operation of the frequency controlled circuit, and the frequency of operation of the frequency controlled circuit is responsive to feedback from the output of the oscillator circuit.

Numerous other inventive aspects and preferred embodiments are also disclosed and claimed.

DETAILED DESCRIPTION OF EMBODIMENTS

Figure 1:
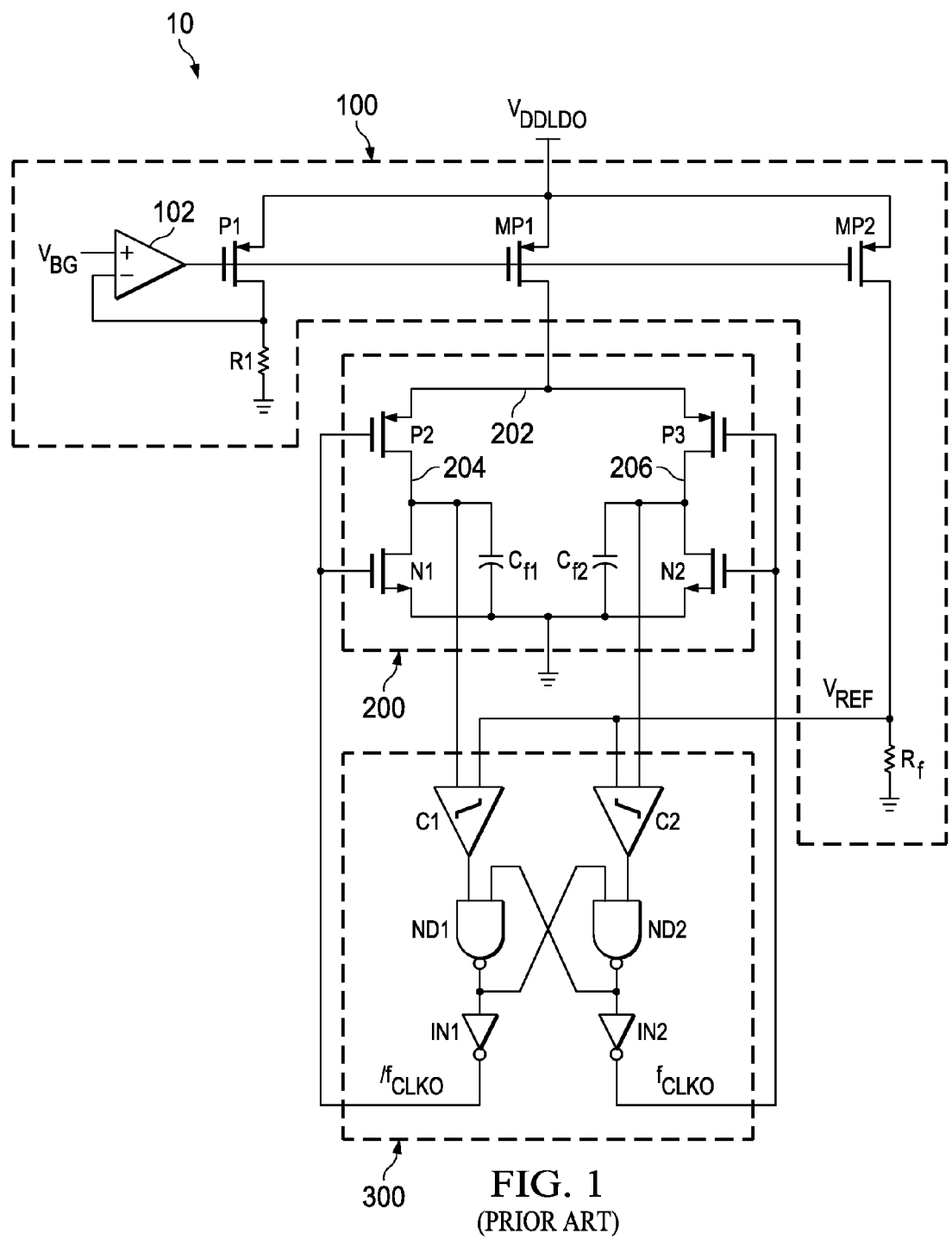
FIG. 1 illustrates a schematic of a prior art relaxation oscillator.

FIG. 1 was discussed above in the Background Of The Invention section of this document, and the reader is assumed to be familiar with that discussion.

Figure 2:
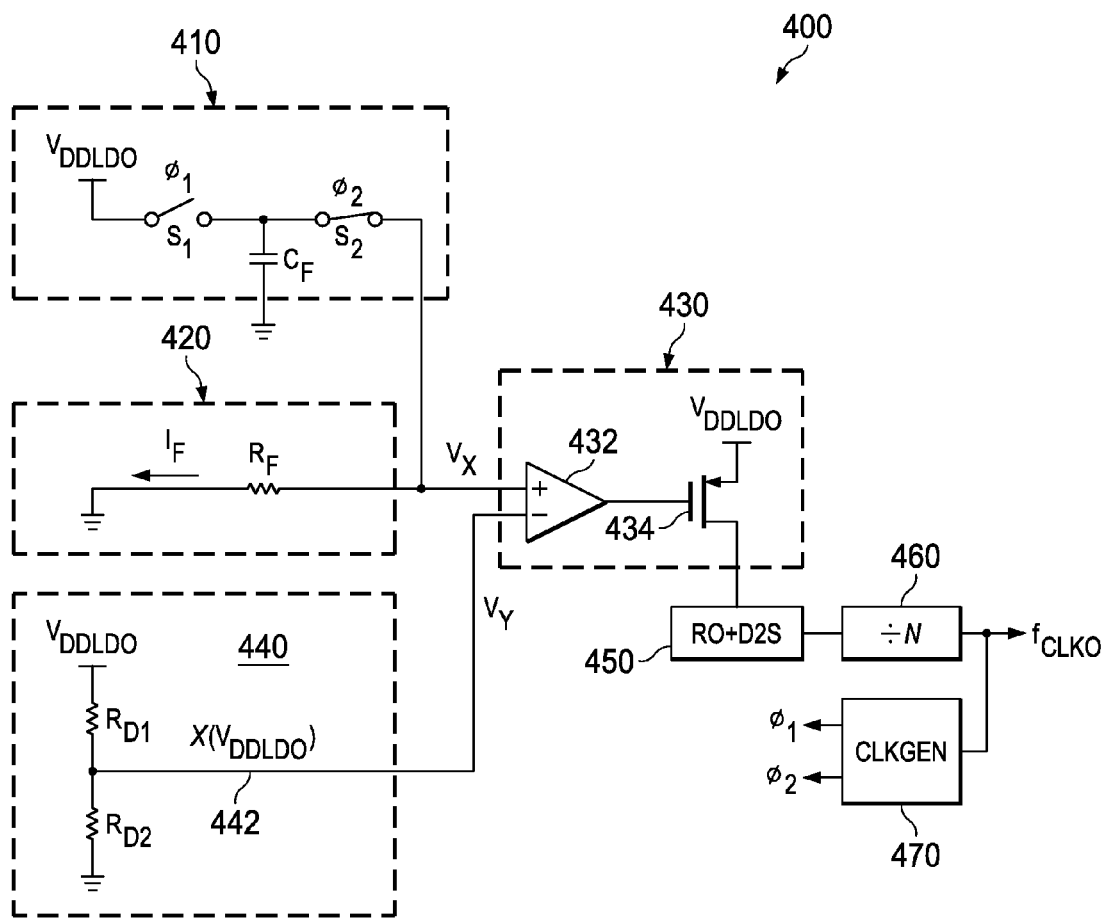
FIG. 2 illustrates a combined schematic and block diagram of an improved oscillator according to a preferred embodiment.

FIG. 2 illustrates a combined schematic and block diagram of an improved oscillator 400 according to a preferred embodiment. Oscillator 400 includes a feedback frequency-controlled current source 410 and a resistance based current source 420, both sharing a node that connects a frequency-controlled voltage $V_x$ to a first input (e.g., non-inverting) of a transconductance circuit 430. Oscillator 400 also includes a voltage divider circuit 440, having a node 442 that connects a voltage $V_y$ to a second input (e.g., inverting) of transconductance circuit 430. Transconductance circuit 430 has an output connected as an input to a combined ring oscillator (RO) and differential-to-single D2S circuit 450, the output of which is connected to a frequency division circuit (÷N) 460, which provides the output clock signal, $f_{CLKO}$, for oscillator 400. The output clock signal, $f_{CLKO}$ is also fed back to a clock generator circuit CLKGEN 470, which provides two non-overlapping phase signals, $\varnothing_1$ and $\varnothing_2$, in response to the single phase of the output clock signal, $f_{CLKO}$. As further explored below, $\varnothing_1$ and $\varnothing_2$ control the switching speed of feedback frequency-controlled current source 410.

Looking to feedback frequency-controlled current source 410 in more detail, it includes a supply voltage $V_{DDLDO}$, which is typically provided by a low dropout voltage source (e.g., regulator) as well-known in the voltage supply art. The actual value of $V_{DDLDO}$ may be based on various considerations, where a contemporary value of 1.5 volts is representative. Supply voltage $V_{DDLDO}$ is connected to a first node of a switch $S_1$, the second node of which is connected to a first node of a switch $S_2$. The second node of switch $S_1$ and first node of switch $S_2$ are connected through a capacitor $C_F$ to ground. Switch $S_1$ opens and closes in response to phase signal $\varnothing_1$ of CLKGEN 470, and switch $S_2$ opens and closes in response to phase signal $\varnothing_2$ of CLKGEN 470. More particularly, since $\varnothing_1$ and $\varnothing_2$ are non-overlapping, then when switch $S_1$ is closed, switch $S_2$ is open, thereby providing charge to capacitor $C_F$, and when switch $S_1$ is open, switch $S_2$ is closed, thereby moving charge from capacitor $C_F$—in these operations, therefore, a current $I_F$ is supplied by the switched capacitor configuration. This current, $I_F$, is compared with resistance based current source 420 and, more particularly, this current passes $I_F$ through a resistor $R_F$ connected between ground and the first input (e.g., non-inverting) of a transconductance circuit 430. Thus, current $I_F$ passing through resistor $R_F$ creates the frequency-controlled voltage V.

Looking to voltage divider circuit 440 in more detail, it includes a resistor voltage divider with a first dividing resistor $R_{D1}$ connected between $V_{DDLDO}$ and node 442 and a second dividing resistor $R_{D2}$ connected between ground and node 442. Node 442 provides the output voltage $V_y$ of voltage divider circuit 440 which, as discussed above, is connected to a second input (e.g., inverting) of transconductance circuit 430.

Looking to transconductance circuit 430 in more detail, it may be constructed using various configurations as known in the art, for converting a differential input voltage to a current. By way of example, therefore, the schematic includes an operational amplifier 432 with the above-mentioned non-inverting and inverting inputs, and an analog output connected to the gate of a p-channel transistor 434. The source of p-channel transistor 434 is connected to $V_{DDLDO}$, and the drain of p-channel transistor 434 provides the output of circuit 430, which as mentioned above is connected to RO/D2S circuit 450.

RO/D2S circuit 450 may be constructed using various configurations as known in the art, with one example shown later in FIG. 5. In general, the oscillator (e.g., ring oscillator) of circuit 450 includes an odd number of cascaded inverters, with the last inverter in the cascade having an output for providing an oscillating signal that is fed back, optionally also via a buffer, to the first inverter in the cascade. In this regard, therefore, an input signal state to the cascade will propagate through the odd number of inverters to appear at the cascade output in a state complementary to the state that was input to the first inverter in the cascade. With this feedback (i.e., the completion of the "ring"), such an oscillator will continue to toggle its output state back and forth, so long as the oscillator is provided a sufficient biasing power (i.e., voltage/current) from transconductance circuit 430. Also in general, the D2S of circuit 450 may take various forms, so as to take the outputs of the RO and then convert them to a rail-to-rail signal.

Frequency division circuit 460 may be constructed using various configurations as known in the art, and it is shown in FIG. 2 with the indication of "(÷N)" to indicate that its circuitry is for dividing the frequency of the output of RO/D2S circuit 450, by 2. Such a divide by 2 frequency division is desired for 50% duty cycle of the clock generated by oscillator circuit $f_{CLKO}$. This is done only to get 50% duty cycle. In some cases, however, this divide by 2 is not required, if 50% duty cycle output is not needed.

CLKGEN 470 may be constructed using various configurations as known in the art, using circuitry to provide the two non-overlapping phase signals, $\varnothing_1$ and $\varnothing_2$, from the single phase of the output clock signal, $f_{CLKO}$.

The operation of oscillator 400 is now described in general, followed by a more detailed analysis of various circuit attributes to enhance an understanding of novel aspects as well as favorable performance. Starting in general, at power-up, $f_{CLKO}$ initially is not operable so the switches $S_1$ and $S_2$ in feedback frequency-controlled current source 410 do not alternate open/closed, current $I_F$ is not created through resistance based current source 420, and the voltage $V_x$ across resistor $R_F$ is low or zero. Voltage divider circuit 440, however, divides $V_{DDLDO}$ according to a ratio X (based on the relative resistance of $R_{D1}$ and $R_{D2}$), so that $V_Y$ is an amount of voltage of X times $V_{DDLDO}$. Thus, initially the inverting input of operational amplifier 432 is greater than its non-inverting input, thereby driving the output operational amplifier 432 low, which is applied to the gate of p-channel transistor 434. P-channel transistor 434 is therefore enabled and supplies current to RO/D2S circuit 450, which begins to oscillate and provides an output oscillating signal, which is divided by N by frequency division circuit 460 to produce the corresponding output clock signal, $f_{CLKO}$, which begins to oscillate. In response to $f_{CLKO}$, CLKGEN 470 begins to provide non-overlapping phase signals, $\varnothing_1$ and $\varnothing_2$, which are fed back to frequency-controlled current source 410. In response to this feedback, frequency-controlled current source 410 begins to provide current $I_F$, so as to raise the voltage $V_x$ across resistor $R_F$, and that voltage $V_x$ is input to the non-inverting input of amplifier 432. In other words, the combination of frequency-controlled current source 410 and resistance based current source 420 effectively provided a frequency-controlled voltage, $V_x$. Further, as is known, the closed loop feedback system will thereafter operate or stabilize toward establishing an equilibrium between the inverting and non-inverting inputs of amplifier 432, thereby adjusting the output of amplifier 432 and the current provided by transconductance circuit 430, so as to stabilize $f_{CLKO}$ at a steady-state frequency, defined in part by the values of $C_F$ and $R_F$ as demonstrated in detail below.

Additional detail and analyses are now provided in connection with various aspects of oscillator 400. Given the closed loop feedback of oscillator 400, then with proper operation of frequency-controlled current source 410, at equilibrium operation (i.e., after any start-up transition) current $I_F$ generated by frequency-controlled current source 410, should be equal to current in the resistance based current source 420, and $V_x$ is pulled by feedback to equal $V_y$. Accordingly, with respect to frequency controlled current source 410 and resistance based current source 420, a voltage divider of $V_{DDLDO}$ is created according to the following Equation 1:

$$V_{DDLDO} = V_{C_F} + V_x \qquad \text{Equation 1}$$

where, $V_{C_F}$ is the voltage across $C_F$ and $V_x$ is the voltage across $R_F$ (and input to the non-inverting input of amplifier 432).

Next, recall that voltage divider circuit 440 divides $V_{DDLDO}$ according to a ratio X, based on the relative resistance of $R_{D1}$ and $R_{D2}$, according to a well known-voltage divider ratio as shown in the following Equation 2:

$$X = \frac{R_{D2}}{R_{D1} + R_{D2}} \qquad \text{Equation 2}$$

From Equation 2, and as introduced above, therefore, then the ratio X divides $V_{DDLDO}$ for the input $V_y$, as shown in the following Equation 3:

$$V_y = X(V_{DDLDO}) \qquad \text{Equation 3}$$

Equation 1 may be rearranged to solve for $V_{C_F}$ as in the following Equation 4:

$$V_{C_F} = V_{DDLDO} - V_x \qquad \text{Equation 4}$$

And because at equilibrium $V_x = V_y$, then the value of $V_y$ from Equation 3 may be substituted into Equation 4, to yield the following Equation 5:

$$V_{C_F} = V_{DDLDO} - X(V_{DDLDO}) = V_{DDLDO}(1-X) \qquad \text{Equation 5}$$

Next, note that the components of feedback frequency-controlled current source 410 included a switched capacitor so that each switching cycle of $S_1$ and $S_2$ transfers charge from $V_{DDLDO}$ to $V_x$ at the switching frequency which is a function of $f_{CLKO}$. More particularly, when $S_1$ is closed and $S_2$ is open due to the non-overlapping phases of $\varnothing_1$ and $\varnothing_2$, charge is stored to capacitor $C_F$, and when $S_2$ is open and $S_1$ is closed also again due to the non-overlapping phases of $\varnothing_1$ and $\varnothing_2$, charge is transferred out of capacitor $C_F$. Charge is therefore transferred at a rate proportional to the frequency of operation of $\varnothing_1$ and $\varnothing_2$, that is, proportional to $f_{CLKO}$. Moreover, the transfer of charge from one node to another is equivalent to a current, and relates to the capacitance of $C_F$. Specifically, the equivalent resistance for the switched capacitor is as shown in the following Equation 6:

$$R_{C_F} = \frac{1}{C_F f_{CLKO}} \qquad \text{Equation 6}$$

By Kirchoff's law, and given the relatively large input impedance of amplifier 432, then the current produced by feedback frequency-controlled current source 410 is the same as the current, $I_F$, through resistor $R_F$, as further shown in the following Equation 7:

$$\frac{V_{C_F}}{\frac{1}{C_F f_{CLKO}}} = \frac{X(V_{DDLDO})}{R_F} \qquad \text{Equation 7}$$

where, $$\frac{V_{C_F}}{\frac{1}{C_F f_{CLKO}}}$$

is the current provided by the feedback frequency-controlled current source 410; and $$\frac{X(V_{DDLDO})}{R_F}$$

is the current $I_F$ through resistor $R_F$.

Substituting Equation 5 in Equation 7 for $V_{C_F}$, and solving for $f_{CLKO}$, is shown in the following Equation 8:

$$f_{CLKO} = \frac{X}{(1-X)} \frac{1}{C_F R_F} \qquad \text{Equation 8}$$

Equation 8 demonstrates, therefore, that the oscillator output frequency, $f_{CLKO}$, is established in response to the $C_F$, $R_F$, and X, and it is independent of $V_{DDLDO}$. Thus, one skilled in the art may select each of these three values so as to achieve a desired $f_{CLKO}$. In other words, $f_{CLKO}$ responds to the capacitance of $C_F$ and $R_F$, and the voltage divider X from the values of $R_{D1}$ and $R_{D2}$ provide an additional "trim" of $f_{CLKO}$. Moreover, below are described additional aspects that may further improve the performance of oscillator 400, such as its precision in terms of insensitivity to temperature changes and various potential non-idealities.

Figure 3:
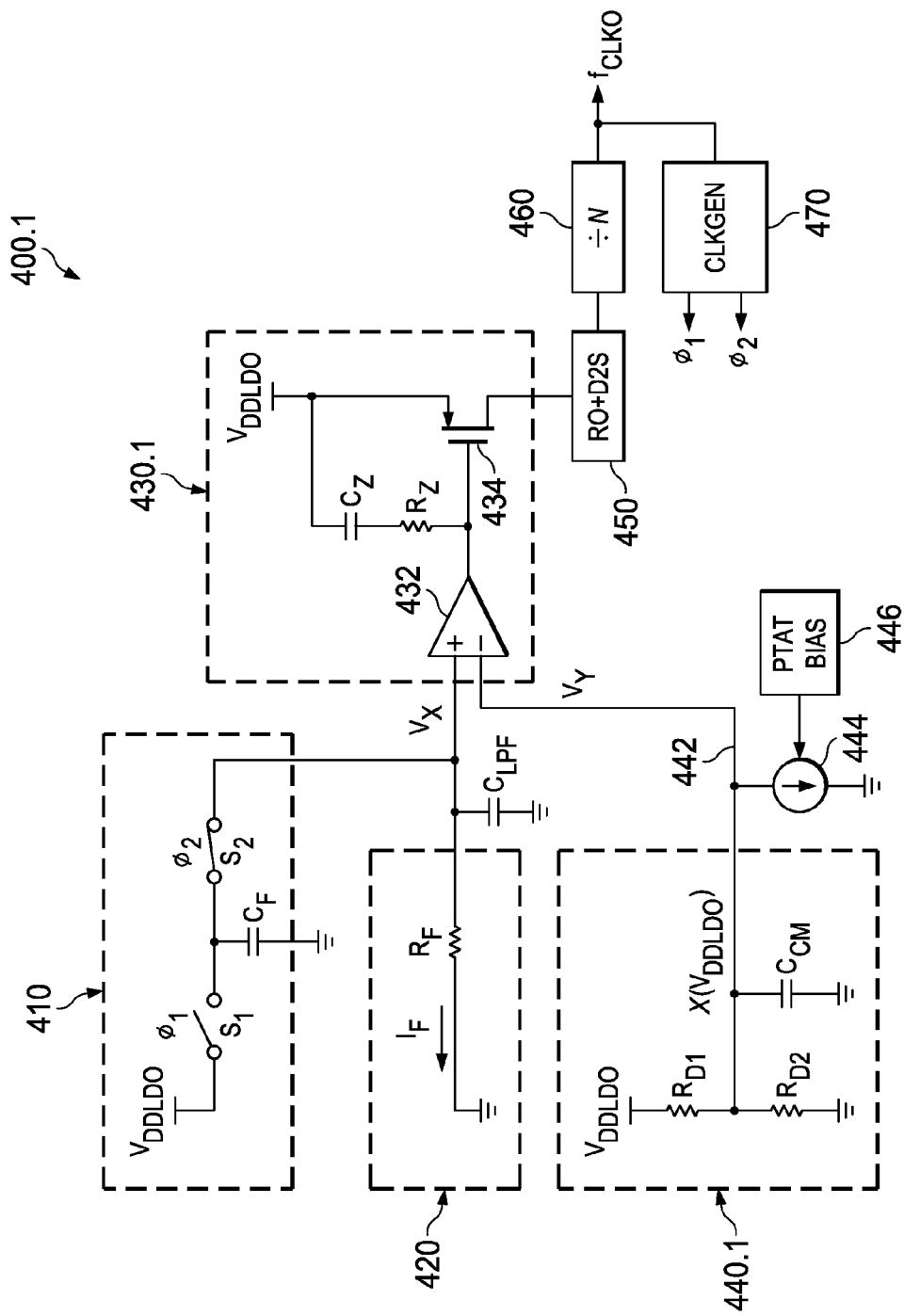
FIG. 3 illustrates a combined schematic and block diagram of an improved oscillator according to an alternative preferred embodiment.

FIG. 3 illustrates a combined schematic and block diagram of an alternative preferred embodiment oscillator indicated generally at 400.1, as it includes various aspects of oscillator 400 of FIG. 2, but with additional components in or in connection with certain blocks of FIG. 2, as further described below and for purposes of providing further performance improvements.

In FIG. 3, a capacitor $C_{LPF}$ is connected between the non-inverting input of amplifier 432 and ground. In a preferred embodiment, the capacitance of capacitor $C_{LPF}$ is selected so as to provide a low pass filter, or stated alternatively, to attenuate or connect any high frequency signals to ground. Such a capacitor is also sometimes referred to as a decoupling capacitor.

Further in FIG. 3, transconductance circuit 430.1 includes a series connection of a resistor $R_Z$ and a capacitor $C_Z$ connected between $V_{DDLDO}$ and the gate of n-channel transistor 434. In a preferred embodiment, resistor $R_Z$ and a capacitor $C_Z$ create an additional zero/pole into oscillator 400.1, in addition to that created by $R_F$ and $C_F$. As a result, therefore, oscillator 400.1 has a second order feedback so as to suppress potential DC errors, such as in comparison to the prior art relaxation oscillator 10 of FIG. 1.

Still further in FIG. 3, a capacitor $C_{CM}$ is connected between node 442 and ground. Like capacitor $C_{LPF}$ described above, capacitor $C_{CM}$ is selected so as to provide a low pass filter, that is, to decouple high frequency signals to ground.

Lastly in FIG. 3, a current source 444, controlled by a PTAT (proportional to absolute temperature) bias block 446, is connected between node 442 and ground. PTAT control is known in the art and may be constructed in various (e.g., MOS transistor) configurations. As its name implies, the control issues a signal proportional to temperature or, more readily, a changing control signal that changes with temperature, and this control correspondingly increases or decreases the current produced by source 444. More specifically, from the above teachings, one skilled in the art will now appreciate that voltage divider circuit 440.1 provides a voltage $V_y$ (i.e., $V_y=X(V_{DDLDO})$) that will be matched in oscillator 400.1 at equilibrium by the voltage $V_x$. The present inventors recognized, however, that capacitor $C_F$ in feedback frequency-controlled current source 410, particularly when constructed as an integrated circuit element (as opposed to an off-circuit discrete element), has a negative temperature coefficient, that is, its capacitance will vary inversely will temperature. In one preferred embodiment, therefore, PTAT bias block 446 and current source 444 may be used to offset, that is, with a positive temperature coefficient, and preferably equally balance or zero, the negative temperature coefficient and effects of capacitor $C_F$. Further in this regard, note also that in such a preferred embodiment, while capacitor $C_F$ is integrated with other circuit elements, resistor $R_F$ is an off-circuit discrete element so as to remove the temperature-dependence its resistance would have if it also were integrated with the circuit elements of oscillator 400.1, and indeed this resistor temperature-dependence is typically somewhat unpredictable. In this preferred embodiment, however, $R_F$ is off circuit, and the more predictable-temperature-dependent $C_F$ is integrated; thus, PTAT bias block 446 and current source 444 are included, so as to compensate by counterbalancing the temperature dependence of $C_F$ and to thereby achieve improved performance in oscillator 400.1 as compared to oscillator 400, assuming an off-circuit discrete resistor (i.e., $R_F$) is permitted in a given implementation.

Figure 4:
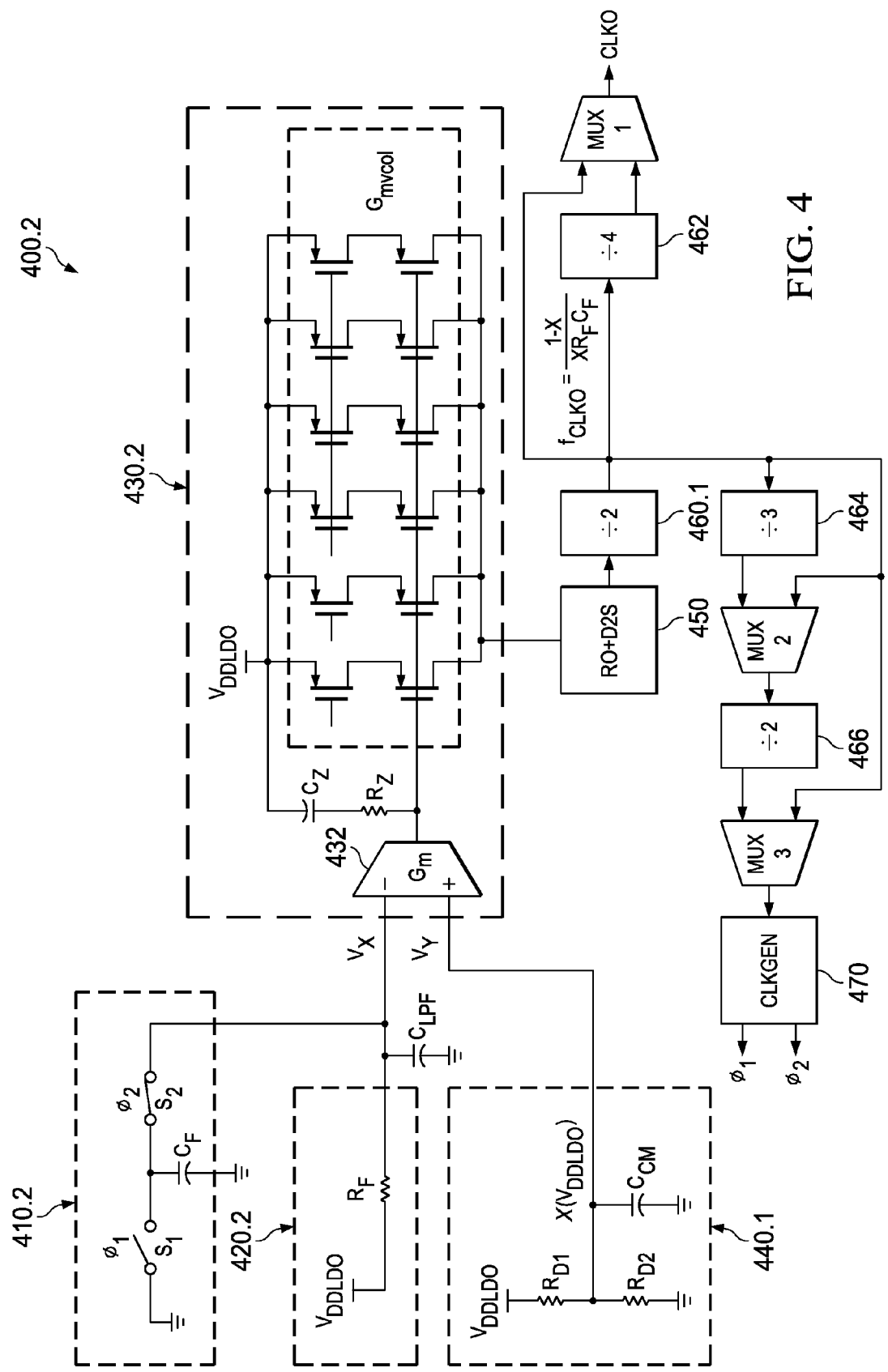
FIG. 4 illustrates a combined schematic and block diagram of an improved oscillator according to another alternative preferred embodiment, with additional details relating to the transconductance circuit.

FIG. 4 illustrates a combined schematic and block diagram of an additional alternative preferred embodiment oscillator indicated generally at 400.2, as it includes various aspects of oscillator 400 of FIG. 2, but with other aspects described below.

Oscillator 400.2 includes a feedback frequency-controlled current source 410.2 and a resistance based current source 420.2, both of which include the same elements as source 410 and circuit 420 described above. In FIG. 4, however, the locations of $V_{DDLDO}$ and ground are reversed along the loop that includes switches $S_1$ and $S_2$ and resistor $R_F$. More specifically, therefore, switch $S_1$ is connected between ground and switch $S_2$, and resistor $R_F$ is connected between $V_{DDLDO}$ and an input to amplifier 432, where in FIG. 4 that input is the inverting input (as opposed to the non-inverting input, as was the case for resistor $R_F$ in FIG. 2).

Given the changes of source 410.2 and circuit 420.2, one skilled in the art will appreciate, relative to earlier embodiments, that at equilibrium, the reference voltage of $X(V_{DDLDO})$ from voltage divider circuit 440.1 will apply across the switched capacitors, with therefore the remaining voltage $(1-X)V_{DDLDO}$ across resistor $R_F$. The current, therefore, through resistor $R_F$ is as shown in the following Equation 9:

$$I_F = \frac{(1-X)(V_{DDLDO})}{R_F} \qquad \text{Equation 9}$$

And, the current through the switched capacitor $C_F$ is as shown in the following Equation 10:

$$I = (X)V_{DDLDO} f_{CLKO} C_F \qquad \text{Equation 10}$$

By Kirchoff's law, and given the relatively large input impedance of amplifier 432, then the currents of Equations 10 and 11 are equal, as further shown in the following Equation 11:

$$\frac{(1-X)(V_{DDLDO})}{R_F} = (X)V_{DDLDO} f_{CLKO} C_F \qquad \text{Equation 11}$$

Rewriting Equation 11 in terms of $f_{CLKO}$ is as shown in Equation 12:

$$f_{CLKO} = \frac{(1-X)}{X} \frac{1}{C_F R_F} \qquad \text{Equation 12}$$

Comparing Equation 12 of oscillator 400.2 from FIG. 4, to Equation 8 of oscillator 400.1 from FIG. 2, one skilled in the art may appreciate therefore that the inventive scope contemplates variations in connectivity and the resultant ratio that is provided based on the ratio of $R_{D1}$ and $R_{D2}$.

FIG. 4 also illustrates that transconductance circuit 430 of FIG. 2 may be expanded into a transconductance circuit 430.2 with additional transistors. The gates of the transistors of circuit 430.2 are controlled by logic high or logic low control signals. In general, if any of the gates is pulled low the pmos current source is active, and if the gate is pulled high pmos current source is in-active. Such components, therefore, are useful, for example, for sourcing additional power to a combined RO/D2S circuit 450. Such additional power may be useful, for example, where supplying differing selectable clock frequencies, as is achieved by oscillator 400.2, as further explored below.

Oscillator 400.2 includes a counterpart to frequency division circuit (÷N) 460 of FIG. 2, where in FIG. 4 this is shown as a ÷2 circuit 460.1. The output of circuit 460.1 is connected by ways of example for selectivity of alternative output frequency signals. More specifically, the output of circuit 460.1 is connected to a first input of a MUX 1, and it also is connected through a ÷4 circuit 462 to a second input of MUX 1. The output of MUX 1 provides the oscillator output frequency, $f_{CLKO}$. The output of MUX 1 provides an output signal shown as CLK0, so as to distinguish is from the output $f_{CLKO}$ from circuit 460.1. Thus, CLK0 can configured to be equal to $f_{CLKO}$ or $f_{CLKO}/4.0$ (from MUX 462) by the select signal of MUX1.

The output of circuit 460.1 is also connected through a feedback path that includes various additional frequency division and multiplexers, by ways of example for selectivity of alternative frequency feedback signals. More specifically, the output of circuit 460.1 is connected as an input to a ÷3 circuit 464, as a first input to a MUX 2, and as a first input to a MUX 3. The output of ÷3 circuit 464 is connected as a second input to MUX 2, and the output of MUX 2 is connected as an input to a ÷2 circuit 466. The output of ÷2 circuit 466 is connected as a second input to MUX 3, and the output of MUX 3 is connected as the input to clock generator circuit CLKGEN 470, which recall from above provides the two non-overlapping phase signals, $\phi_1$ and $\phi_2$, for switches $S_1$ and $S_2$, respectively.

FIG. 4 and the above description, therefore, demonstrate that multiplexers MUX 1, MUX 2, and MUX 3 are included for selectivity of various signals as either the oscillator output frequency, $f_{CLKO}$, or the feedback frequency that is used by clock generator circuit CLKGEN 470 to provide $\phi_1$ and $\phi_2$. Note further, therefore, that the selection among these multiplexers will influence the feedback frequency and, hence, also $f_{CLKO}$. For example, if MUX3 bypasses both MUX 2 and ÷3 circuit 464, then $f_{CLKO}$ is as shown in the Figure and as described earlier in connection with Equation 12. If, as another example, however, MUX2 bypasses ÷3 circuit 464 but then outputs that signal through ÷3 circuit 466 for selection by MUX3, then $f_{CLKO}=2*((1-X)/X)*(1/R_F C_F)$. As another example, if the division in feedback loop is % 6 by passing through both circuits 464 and 466, then $f_{CLKO}=6*((1-X)/X)*(1/R_F C_F)$.

Figure 5:
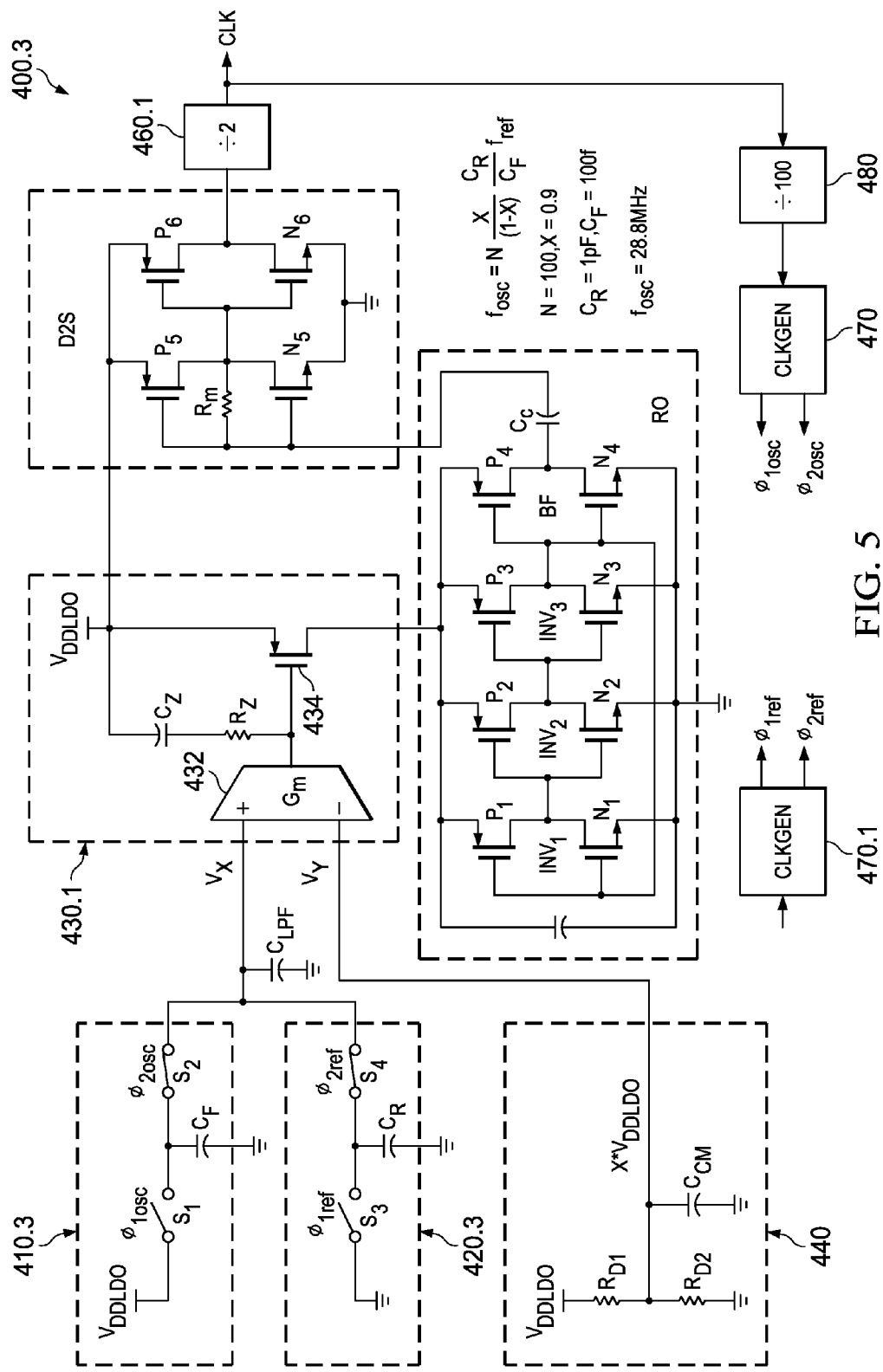
FIG. 5 illustrates a combined schematic and block diagram of an improved oscillator according to an alternative phase locked loop preferred embodiment, a frequency-controlled current source using two switched capacitors, and additional details relating to the ring oscillator.

FIG. 5 illustrates a combined schematic and block diagram of an alternative preferred embodiment oscillator indicated generally at 400.3, as it includes various aspects of earlier-described oscillators, but with other aspects described below. Indeed, the following discussion demonstrates that oscillator 400.3 is implemented into a form of a phase locked loop.

Oscillator 400.3 includes a feedback frequency-controlled current source 410.3 that includes a switch $S_1$ connected between $V_{DDLDO}$ and a switch $S_2$. Switch $S_2$ is further connected to the non-inverting input of amplifier 432, and a capacitor $C_F$ is connected between the switches and ground. For sake of reference in FIG. 5, switch $S_1$ operates in response to $\phi_{1osc}$ and switch $S_2$ operates in response to $\phi_{2osc}$, where both $\phi_{1osc}$ and $\phi_{2osc}$ are provided by a clock generator circuit CLKGEN 470, comparable to $\phi_1$ and $\phi_2$, described above.

Continuing with oscillator 400.3, it includes a resistance based current source 420.3 which, in contrast to earlier resistance based current source circuits 420 and 420.2, does not include the resistor $R_F$ from those earlier embodiments and instead uses a switched capacitor network. Specifically, instead of that resistor $R_F$ in circuit 420.2, an additional switched capacitor configuration is included as designated by switches $S_3$ and $S_4$, in combination with a capacitor $C_R$. Moreover, switches $S_3$ and $S_4$ are switched by an alternative set of non-overlapping reference signals, shown as $\phi_{1ref}$ and $\phi_{2ref}$. Signals $\phi_{1ref}$ and $\phi_{2ref}$ may be provided by a clock generator circuit CLKGEN 470.1 that is comparable to clock generator circuit CLKGEN 470, but the former is not driven from a feedback of the oscillator output, and instead may be from an alternative source as selectable by one skilled in the art and to generate the phase signals in response to a reference frequency $f_{ref}$. In the present context, the common frequency of $\phi_{1ref}$ and $\phi_{2ref}$ serves as a reference input signal to which the phase of oscillator 400.3 will track, that is, as a reference frequency for the phase-locked loop operation.

The use of an additional capacitor network in resistance based current source 420.2 affects the relationship of the oscillator output frequency, as is now explored. Given the earlier discussion of equivalent resistance and operation of the switched capacitor $C_F$, one skilled in the art should appreciate a comparable understanding with respect to switched capacitor $C_R$. Thus, the reference voltage $X(V_{DDLDO})$ from voltage divider circuit 440 is applied to switched capacitor $C_R$, while the remaining voltage $(1-X)$ $(V_{DDLDO})$ is applied to switched capacitor $C_F$. Hence, the current provided via the switched capacitor $C_F$ is as shown in the following Equation 13, and the current via the switched capacitor $C_R$ is as shown in the following Equation 14:

$$I=(1-X)V_{DDLDO}f_{osc}C_F \qquad \text{Equation 13}$$

$$I=X(V_{DDLDO})f_{ref}C_R \qquad \text{Equation 14}$$

By Kirchoff's law, and given the relatively large input impedance of amplifier 432, then the currents of Equations 13 and 14 are equal, so Equations 13 and 14 can be set to equal to one another, and solving for $f_{osc}$ yields the following Equation 15:

$$f_{osc} = \frac{X}{(1-X)}\frac{C_R}{C_F}f_{ref} \qquad \text{Equation 15}$$

Equation 15, therefore, demonstrates that the oscillator output frequency may be selected in response to the additional variables of $C_R$ and $f_{ref}$, as compared to earlier embodiments. In addition, however, the use of a frequency division circuit (÷N) 480, described below, further influences the rate of $f_{osc}$ and, hence, further modifies the oscillator output frequency beyond that shown in Equation 15.

The FIG. 5 illustration of oscillator 400.3 also includes an example of how the RO circuit introduced above may be constructed. The RO circuit includes three sets of paired transistors each forming a respective inverter (INV$_1$, INV$_2$, INV$_3$), where each set includes a p-channel transistor having its source connected to transconductance circuit 430.1, an n-channel transistor having its source connected to ground, the drains of the paired transistors connected together to form an inverter output, and the gates of the paired transistors connected together to form an inverter input. Inverter INV$_1$ (transistors P$_1$ and N$_1$) therefore provides an output to the input of inverter INV$_2$ (transistors P$_2$ and N$_2$), inverter INV$_2$ therefore provides an output to the input of inverter INV$_3$ (transistors P$_3$ and N$_3$), and inverter INV$_3$ therefore provides an output to the input of inverter INV$_1$, thereby forming the ring of inverters for the oscillator. Finally, the output of inverter INV$_3$ is also connected to an additional transistor pair of an n-channel and p-channel transistor (transistors P$_4$ and N$_4$, respectively), forming a buffer BF, with its output connected through a capacitor $C_C$ to the input of D2S circuit.

The FIG. 5 illustration of oscillator 400.3 also includes an example of how the D2S circuit introduced above may be constructed. The input of D2S circuit is connected to the gate of a first transistor pair having a p-channel transistor P$_5$ with its source connected to V$_{DDLDO}$, an n-channel transistor N$_5$ having its source connected to ground, the drains of transistors N$_5$ and P$_5$ connected to each other, and the gates of transistors N$_5$ and P$_5$ also connected to each other, with a resistor R$_m$ connected between the commonly-connected gates and the commonly-connected sources. D2S circuit further includes a second transistor pair having a p-channel transistor P$_6$ with its source connected to V$_{DDLDO}$, an n-channel transistor N$_6$ having its source connected to ground, the drains of transistors N$_6$ and P$_6$ connected to each other and providing the D2S circuit output, and the gates of transistors N$_6$ and P$_6$ also connected to each other and to the common-connected drains of transistors N$_5$ and P$_5$.

The output of oscillator 400.3 is connected as feedback to a frequency division circuit (÷N) 480, where in the example of FIG. 5, N=100. Circuit 480 therefore divides $f_{osc}$ by 100, providing a frequency reduction of two orders of magnitude to clock generator circuit CLKGEN 470. Thus, CLKGEN 470 provides the non-overlapping phase signals, $\emptyset_{1osc}$ and $\emptyset_{2osc}$, from a signal 100 times slower than the oscillator clock signal, $f_{osc}$. As a result, the power consumption by components operating in response to $\emptyset_{1osc}$ and $\emptyset_{2osc}$ are considerably reduced as compared to what would be the consumption if the reduction were not applied, such as in the prior art. Moreover, such reduction is in contrast to the prior art (e.g., FIG. 1) instances wherein the charge and discharge of capacitance is at the same rate as the oscillator output. Lastly in this regard, therefore, note that the oscillator output, $f_{osc}$, is also further affected by the divisor of frequency division circuit (÷N) 480, yielding the final output as shown in the following Equation 16:

$$f_{osc} = N\frac{X}{(1-X)}\frac{C_R}{C_F}f_{ref} \qquad \text{Equation 16}$$

Figure 6:
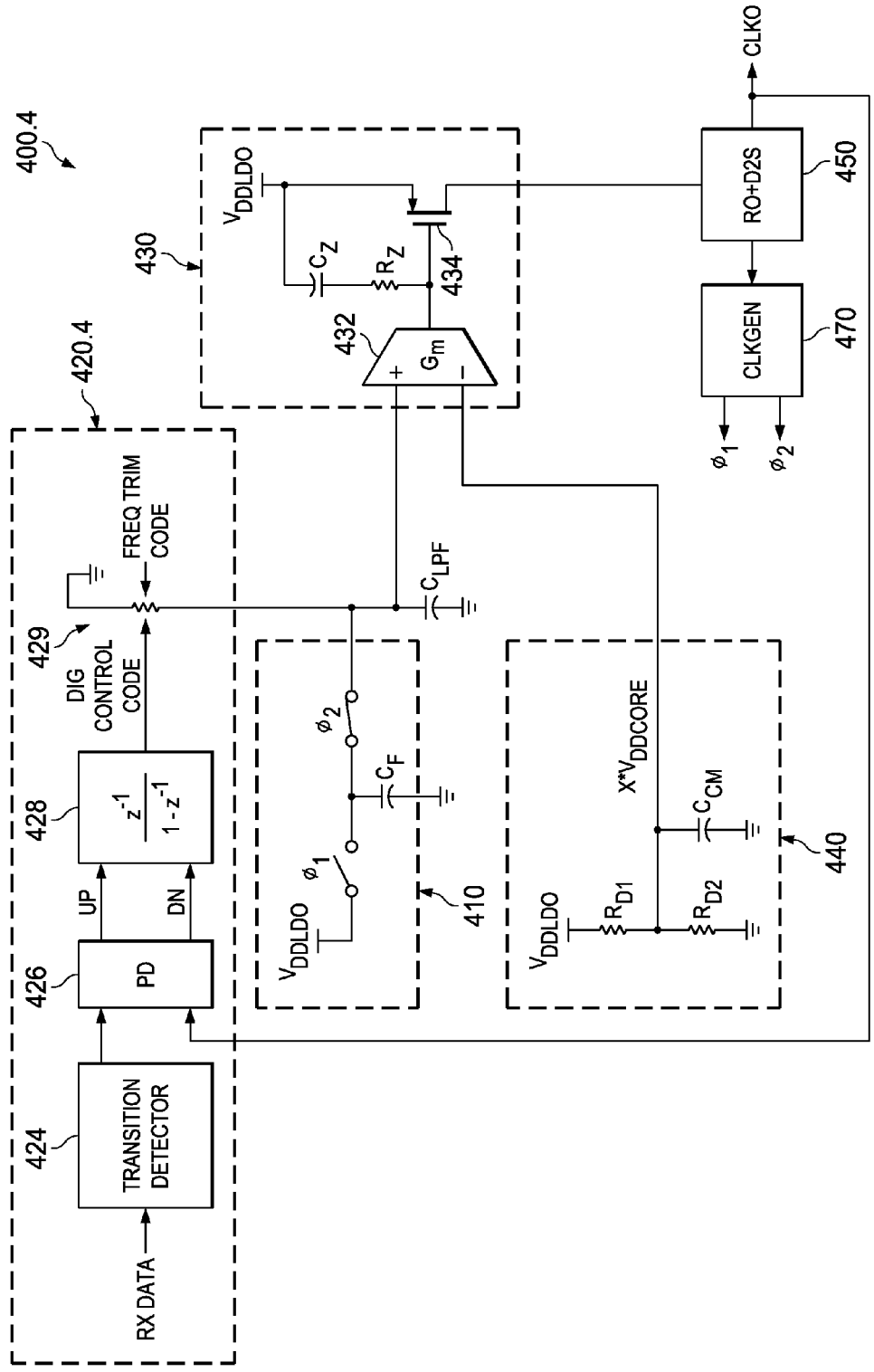
FIG. 6 illustrates a combined schematic and block diagram of an improved oscillator according to an alternative clock data recovery circuit preferred embodiment.

FIG. 6 illustrates a combined schematic and block diagram of an alternative preferred embodiment oscillator indicated generally at 400.4, as it includes various aspects of earlier-described oscillators, but with other aspects described below. Indeed, the following discussion demonstrates that oscillator 400.4 is implemented into a form of a clock data recovery circuit.

Oscillator 400.4 includes a resistance based current source 420.4 so that oscillator 400.4 operates toward a clock data recovery function. In this regard, circuit 420.4 includes a transition detector 424, a phase detector (PD) 426, and a Z-transform circuit 428. More particularly, transition detector 424 receives an incoming data stream, RX DATA. The output of transition detector 424 is connected as an input to PD 426, which also receives as an input the oscillator output, CLKO. Note also that oscillator 400.4 provides an example where a 50% duty cycle output is not required and, hence, there is not a divide by 2. The output of PD 426 provides an up or down signal based on the relative phase difference between its two inputs, which is filtered by Z-transform circuit 428 to provide a digital control code to a variable resistance 429. Variable resistance 429, therefore, ultimately serves a comparable function as resistor R$_F$, discussed earlier in connection with resistance based current source 420 in previously-described embodiments. Thus, the variability of variable resistance 429 allows an adjustment in the output frequency of CLKO, which as governed by PD 426 will allow the desired functionality of matching the frequency of CLKO with the detected transitions of detector 424. In this manner, therefore, CLKO is aligned with the incoming RX DATA, so that sampling of such DATA may be properly synchronized.

From the above, various embodiments provide numerous improvements to integrated circuit oscillators. Such benefits include the elimination of the non-idealities of comparators, as used in prior art relaxation oscillators. Benefits also are achieved with optimal performance using an external resistor R$_F$ in combination with a PTAT to compensate for $C_F$. As yet another benefit, various embodiments permit additional trimming of the oscillator output frequency via the voltage divider of voltage divider circuit 440. Moreover, through the preferred embodiment use of second order feedback, additional DC errors are suppressed. Still further, oscillator power consumption can be reduced by operating the switching frequency of the frequency-controlled current source so as to charge/discharge its capacitor at a rate less than the oscillator output frequency. Still further, frequency accuracy in response to changes in temperature is improved over the prior art. Yet still further, related preferred embodiment devices that incorporate the inventive oscillator may be readily developed, such as the illustrated phase locked loop or detectors clock data recovery circuit. Various aspects have been described, and still others will be ascertainable by one skilled in the art from the present teachings. Still further, while various alternatives have been provided according to the disclosed embodiments, still others are contemplated; for example, the preferred embodiment oscillator may be implemented into yet additional devices, and additional components may be added or additional manners of implementing a feedback frequency-controlled current source. Moreover, still others can ascertained by one skilled in the art. Given the preceding, therefore, one skilled in the art should further appreciate that while some embodiments have been described in detail, various substitutions, modifications or alterations can be made to the descriptions set forth above without departing from the inventive scope, as is defined by the following claims.

The invention claimed is:

1. Circuitry for providing an oscillating output signal, comprising:
    a transconductance circuit having a first input, a second input, and an output;
    an oscillator circuit coupled to receive voltage from the output of the transconductance circuit, wherein the oscillating output signal is responsive to an output of the oscillator circuit;
    circuitry for providing a first voltage to the first input of the transconductance circuit;
    a frequency controlled circuit for providing a second voltage to the second input the transconductance circuit;
    wherein the second voltage is responsive to a frequency of operation of the frequency controlled circuit; and
    wherein the frequency of operation of the frequency controlled circuit is responsive to feedback derived from the output of the oscillator circuit;
    wherein the frequency controlled circuit comprises:
    a first switch and a second switch operable to open and close in non-overlapping phases responsive to the output of the oscillator circuit; and
    a capacitor connected from a node, between the first switch and the second switch, and a reference voltage; and
    wherein the non-overlapping operation of the first switch and the second switch creates a current by respectively charging and discharging the capacitor;
    wherein the frequency controlled circuit further comprises:
    a variable resistance, wherein the second voltage is responsive to the current passing through the resistance; and
    phase detection circuitry for adjusting the variable resistance in response to a phase comparison of a phase of an input data stream and a phase responsive to an output of the oscillator circuit.

2. Circuitry for providing an oscillating output signal, comprising:
    a transconductance circuit having a first input, a second input, and an output;
    an oscillator circuit coupled to receive voltage from the output of the transconductance circuit, wherein the oscillating output signal is responsive to an output of the oscillator circuit;
    circuitry for providing a first voltage to the first input of the transconductance circuit;
    a frequency controlled circuit for providing a second voltage to the second input the transconductance circuit;
    wherein the second voltage is responsive to a frequency of operation of the frequency controlled circuit; and
    wherein the frequency of operation of the frequency controlled circuit is responsive to feedback derived from the output of the oscillator circuit;
    wherein the frequency controlled circuit comprises:
    a first switch and a second switch operable to open and close in non-overlapping phases responsive to the output of the oscillator circuit; and
    a capacitor connected from a node, between the first switch and the second switch, and a reference voltage; and
    wherein the non-overlapping operation of the first switch and the second switch creates a current by respectively charging and discharging the capacitor;
    wherein the transconductance circuit, oscillator, circuitry for providing a first voltage, first switch, second switch, capacitor, and resistance are integrated in a single integrated circuit;
    wherein the frequency controlled circuit further comprises:
    a variable resistance, wherein the second voltage is responsive to the current passing through the resistance; and
    phase detection circuitry for adjusting the variable resistance in response to a phase comparison of a phase of an input data stream and a phase responsive to an output of the oscillator circuit.

3. Circuitry for providing an oscillating output signal, comprising:
    a transconductance circuit having a first input, a second input, and an output;
    an oscillator circuit coupled to receive voltage from the output of the transconductance circuit, wherein the oscillating output signal is responsive to an output of the oscillator circuit;
    circuitry for providing a first voltage to the first input of the transconductance circuit;
    a frequency controlled circuit for providing a second voltage to the second input the transconductance circuit;
    wherein the second voltage is responsive to a frequency of operation of the frequency controlled circuit; and
    wherein the frequency of operation of the frequency controlled circuit is responsive to feedback derived from the output of the oscillator circuit;
    wherein the frequency controlled circuit comprises:
    a first switch and a second switch operable to open and close in non-overlapping phases responsive to the output of the oscillator circuit; and
    a capacitor connected from a node, between the first switch and the second switch, and a reference voltage; and wherein the non-overlapping operation of the first switch and the second switch creates a current by respectively charging and discharging the capacitor;

wherein the transconductance circuit, oscillator, circuitry for providing a first voltage, first switch, second switch, and capacitor are integrated in a single integrated circuit wherein the frequency controlled circuit further comprises:

a variable resistance, wherein the second voltage is responsive to the current passing through the resistance; and phase detection circuitry for adjusting the variable resistance in response to a phase comparison of a phase of an input data stream and a phase responsive to an output of the oscillator circuit.

4. The circuitry of claim 3 and further comprising proportional to absolute temperature circuitry for offsetting a temperature coefficient of the capacitor.

5. Circuitry for providing an oscillating output signal, comprising:

a transconductance circuit having a first input, a second input, and an output;

an oscillator circuit coupled to receive voltage from the output of the transconductance circuit, wherein the oscillating output signal is responsive to an output of the oscillator circuit;

circuitry for providing a first voltage to the first input of the transconductance circuit;

a frequency controlled circuit for providing a second voltage to the second input the transconductance circuit;

wherein the second voltage is responsive to a frequency of operation of the frequency controlled circuit; and wherein the frequency of operation of the frequency controlled circuit is responsive to feedback derived from the output of the oscillator circuit;

wherein the frequency controlled circuit comprises:

a first switch and a second switch operable to open and close in non-overlapping phases responsive to the output of the oscillator circuit; and a capacitor connected from a node, between the first switch and the second switch, and a reference voltage; and wherein the non-overlapping operation of the first switch and the second switch creates a current by respectively charging and discharging the capacitor;

wherein the frequency controlled circuit further comprises:

a variable resistance, wherein the second voltage is responsive to the current passing through the resistance; and phase detection circuitry for adjusting the variable resistance in response to a phase comparison of a phase of an input data stream and a phase responsive to an output of the oscillator circuit.

6. Circuitry for providing an oscillating output signal, comprising:

a transconductance circuit having a first input, a second input, and an output;

an oscillator circuit coupled to receive voltage from the output of the transconductance circuit, wherein the oscillating output signal is responsive to an output of the oscillator circuit;

circuitry for providing a first voltage to the first input of the transconductance circuit;

a frequency controlled circuit for providing a second voltage to the second input the transconductance circuit;

wherein the second voltage is responsive to a frequency of operation of the frequency controlled circuit; and wherein the frequency of operation of the frequency controlled circuit is responsive to feedback derived from the output of the oscillator circuit;

further comprising selectable circuitry for dividing the oscillating output signal for providing the feedback derived from the output of the oscillator circuit;

wherein the frequency controlled circuit further comprises:

a variable resistance, wherein the second voltage is responsive to the current passing through the resistance; and phase detection circuitry for adjusting the variable resistance in response to a phase comparison of a phase of an input data stream and a phase responsive to an output of the oscillator circuit.

7. The circuitry of claim 6 wherein the selectable circuitry comprises one or more multiplexers.

8. Circuitry for providing an oscillating output signal, comprising:

a transconductance circuit having a first input, a second input, and an output;

an oscillator circuit coupled to receive voltage from the output of the transconductance circuit, wherein the oscillating output signal is responsive to an output of the oscillator circuit;

circuitry for providing a first voltage to the first input of the transconductance circuit;

a frequency controlled circuit for providing a second voltage to the second input the transconductance circuit;

wherein the second voltage is responsive to a frequency of operation of the frequency controlled circuit; and wherein the frequency of operation of the frequency controlled circuit is responsive to feedback derived from the output of the oscillator circuit;

wherein the frequency controlled circuit comprises:

a first switch and a second switch operable to open and close in non-overlapping phases responsive to the output of the oscillator circuit; and a first capacitor connected from a node, between the first switch and the second switch, and a first reference voltage;

wherein non-overlapping operation of the first switch and the second switch creates a current by respectively charging and discharging the first capacitor; and a third switch and a fourth switch operable to open and close in non-overlapping phases in response to a reference oscillator signal; and a second capacitor connected from a node, between the third switch and the fourth switch, and a second reference voltage; and wherein the non-overlapping operation of the third switch and the fourth switch creates a current by charging and discharging the second capacitor;

a variable resistance, wherein the second voltage is responsive to the current passing through the resistance; and phase detection circuitry for adjusting the variable resistance in response to a phase comparison of a phase of an input data stream and a phase responsive to an output of the oscillator circuit.

9. The circuitry of claim 8 wherein the feedback is for creating a phase locked loop match of frequency to the reference oscillator signal.

10. A method of providing an oscillating output signal, comprising:
- providing a first voltage to a first input of a transconductance circuit, the transconductance circuit further having a second input and an output;
- providing a voltage from the transconductance circuit to an oscillator circuit, wherein the oscillating output signal is responsive to an output of the oscillator circuit; and
- providing a second voltage to the second input the transconductance circuit from a frequency controlled circuit;
- wherein the second voltage is responsive to a frequency of operation of the frequency controlled circuit; and
- wherein the frequency of operation of the frequency controlled circuit is responsive to feedback derived from the output of the oscillator circuit;
- wherein the frequency controlled circuit comprises:
  - a first switch and a second switch operable to open and close in non-overlapping phases responsive to the output of the oscillator circuit; and
  - a capacitor connected from a node, between the first switch and the second switch, and a reference voltage; and
- wherein the non-overlapping operation of the first switch and the second switch creates a current by respectively charging and discharging the capacitor;
  - wherein the frequency controlled circuit further comprises:
    - a variable resistance, wherein the second voltage is responsive to the current passing through the resistance; and
    - phase detection circuitry for adjusting the variable resistance in response to a phase comparison of a phase of an input data stream and a phase responsive to an output of the oscillator circuit.

* * * * *